US008867256B2

(12) United States Patent
Schwartz (10) Patent No.: US 8,867,256 B2
(45) Date of Patent: Oct. 21, 2014

(54) SYSTEMS AND METHODS FOR WRITING AND NON-DESTRUCTIVELY READING FERROELECTRIC MEMORIES

(71) Applicant: Palo Alto Research Center Incorporated, Palo Alto, CA (US)

(72) Inventor: David Eric Schwartz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 38 days.

(21) Appl. No.: 13/626,844

(22) Filed: Sep. 25, 2012

(65) Prior Publication Data

US 2014/0085963 A1    Mar. 27, 2014

(51) Int. Cl.
*G11C 11/22* (2006.01)

(52) U.S. Cl.
USPC ............................................. 365/145

(58) Field of Classification Search
CPC ....................................... G11C 11/22
USPC .......................................... 365/145
See application file for complete search history.

(56) References Cited

U.S. PATENT DOCUMENTS

| | | | | |
|---|---|---|---|---|
| 5,523,964 A * | 6/1996 | McMillan et al. | ............ | 365/145 |
| 5,768,176 A * | 6/1998 | Katoh | ............ | 365/145 |
| 6,188,600 B1 * | 2/2001 | Ishiwara | ............ | 365/145 |
| 6,191,441 B1 * | 2/2001 | Aoki et al. | ............ | 257/295 |
| 6,198,652 B1 * | 3/2001 | Kawakubo et al. | ............ | 365/145 |
| 6,327,172 B1 * | 12/2001 | Ishiwara | ............ | 365/145 |
| 6,385,076 B1 * | 5/2002 | Fujimori | ............ | 365/145 |
| 6,459,110 B1 * | 10/2002 | Tani | ............ | 257/295 |
| 6,510,073 B1 * | 1/2003 | Lee et al. | ............ | 365/145 |
| 6,614,678 B2 * | 9/2003 | Kato et al. | ............ | 365/145 |
| 6,859,381 B2 * | 2/2005 | Ohtsuka et al. | ............ | 365/145 |
| 6,898,105 B2 * | 5/2005 | Sakai et al. | ............ | 365/145 |

OTHER PUBLICATIONS

Naber et al., "Organic nonvolatile memory devices based on ferroelectricity," Adv. Mater. 22, 2010, pp. 933-945.

* cited by examiner

*Primary Examiner* — Son Mai
(74) *Attorney, Agent, or Firm* — Ronald E. Prass, Jr.; Prass LLP (57) ABSTRACT

Ferroelectric memory cell configurations, a system for controlling writing and reading to those configurations and a method for employing those configurations for writing and reading ferroelectric memories are provided. Ferroelectric memory cells according to the disclosed configurations are read without disturbing the stored data, i.e., not requiring any modification of the stored polarization state of the ferroelectric memory cell to read the stored data, thus providing a "non-destructive" reading process. Ferroelectric memory cells are read without requiring that a charge or sense amplifier be a part of the ferroelectric memory cell. Various transistor configurations provide a capability to read a signal effect through a transistor channel as an indication of capacitance of a ferroelectric memory cell polarization state.

22 Claims, 6 Drawing Sheets

SYSTEMS AND METHODS FOR WRITING AND NON-DESTRUCTIVELY READING FERROELECTRIC MEMORIES

This application is related to U.S. patent application Ser. No. 13/626,840, entitled "Systems and Methods for Reading Ferroelectric Memories," filed on a same day as this application, the disclosure of which is hereby incorporated by reference herein in its entirety.

BACKGROUND

1. Field of the Disclosed Embodiments

This disclosure relates to systems and methods for reading and writing ferroelectric memories and for implementing the reading and writing processes using organic or other thin-film transistors, where the reading is effected in a non-destructive manner to the stored data and/or the writing function is separated from the reading function in the writing/reading circuitry.

2. Related Art

Ferroelectric memories are non-volatile electric memory components that store information as remnant polarization in a ferroelectric material. A wide variety of usable ferroelectric materials exist. Often, the ferroelectric materials in ferroelectric memories are provided in the form of ferroelectric polymers including, for example, poly(vinylidenefluoride-co-trifluoroethylene) or P(VDF-TrFE), which tend to be very attractive in many ferroelectric memory applications based on the ease with which they can be physically manipulated and the ease with which the ferroelectric properties can be modified. Devices employing ferroelectric memories tend to have comparatively lower power usage and faster write performance than those using other memory technologies. They tend to support a greater maximum number of write-erase cycles. Also, they can be printed circuits. These advantages are balanced against certain disadvantages including lower storage densities, storage capacity limitations, and higher costs.

Typically, the ferroelectric capacitor constitutes an electronic device in which the ferroelectric material is sandwiched between two electrodes to form the capacitor with the ferroelectric material as the dielectric. In a simple, straightforward and conventionally-employed configuration, the ferroelectric capacitor will be in a parallel plate configuration, but other varied structures are possible and are often implemented.

Ferroelectric materials are characterized by having remnant polarization after an electric field has been applied and removed. A ferroelectric material has a nonlinear relationship between the applied electric field and the apparent stored charge. Specifically, the ferroelectric characteristic has the form of a hysteresis loop, which is very similar in shape to the hysteresis loop of ferromagnetic materials. Hysteresis loops associated with ferroelectric materials show that typically when a positive or negative electric field is applied across ferroelectric materials such as in a ferroelectric capacitor, a particular polarization response results. See FIG. 1 in the [056-0525] Application. If the applied electric field is of a sufficient magnitude, the capacitor will retain its polarization even after the field is removed. A ferroelectric capacitor is bistable, with two different polarization states being possible when no electric field is applied. The polarization state exhibited by the ferroelectric material, particularly as it is used in a ferroelectric memory, can be used to represent a single binary bit value of the data stored in the ferroelectric memory, i.e., a "1" or a "0". A "set" value at either of these two stable points on the hysteresis loop for the particular ferroelectric material will remain stable when no electric field is presented after the data has been "written" to the ferroelectric material. For a more detailed discussion, see Naber et al., "Organic nonvolatile memory devices based on ferroelectricity," Adv. Mater. 22, 2010, pp. 933-45 (hereinafter "Naber"), which is incorporated herein by reference describing the state of the art in ferroelectric memories in organic nonvolatile memory devices.

A bit of data is written to the ferroelectric memory by applying a bias across the ferroelectric material. A positive bias may write one state ("1") value and a negative bias may write another state ("0") value, or vice versa depending on a polarization of a ferroelectric memory. When an external electric field is applied across a ferroelectric material, dipoles in the material will tend to align themselves with the field direction, produced by small shifts in the positions of atoms and shifts in the distributions of electronic charge in the crystalline structure. After the charge is removed, the dipoles retain their polarization state. The binary values of "0" and "1" are thus stored as one of two possible electric polarizations in each ferroelectrically-based data storage cell.

In a typical configuration, data is stored according to a binary polarization state of the ferroelectric capacitor, as described above. Writing to the cells is typically accomplished by (1) applying a positive bias across the ferroelectric capacitor to write a "1", or (2) applying a negative bias across the ferroelectric capacitor to write a "0". Reading from the cells is typically accomplished by applying a negative bias across the ferroelectric capacitor and measuring the amount of charge released by the capacitor. This charge may be measured using one of a sense amplifier or a charge integrator, either of which may be used to convert the charge into a large voltage. The amount of charge measured depends on the polarization state held by the ferroelectric capacitor, with a larger charge magnitude corresponding to a "1" state and a smaller charge magnitude corresponding to a "0" state. It is important to note that the above description refers to the cell having "held" a charge, because the reading process is destructive. After the reading process, the cell typically always holds a "0" value. Once the cell has been read, if the cell held a "1," the cell must be re-charged to that value again. Also, those of skill in the art recognize that, as used in the above discussion, the designations of "positive," "negative," "1," and "0," and their relationships to one another are arbitrarily assigned and that other combinations are appropriate.

SUMMARY OF DISCLOSED SUBJECT MATTER

The above-described method suffers from a couple of drawbacks that can be considered reasonably significant in their effect on certain applications in which ferroelectric memory cells may find utility.

First, the above-described conventional method requires comparatively sensitive charge-measurement circuitry, usually a charge-integrating amplifier or sense amplifier, which can be challenging or impossible to fabricate in many processes, including using printed organic semiconductor processes.

Common to the conventional reading processes is the presence of, and requirement for, a charge or sense amplifier as a separate component of the printed circuit that constitutes the memory cell. Despite the many available variations of charge-sensing readouts, all of these variations share the feature of requiring a precision charge or sense amplifier. In certain situations, the presence of a charge or sense amplifier is undesirable. The required inclusion of the charge or sense amplifier in the charge-sensing cell circuitry adds cost to the memory cell that is comparatively significant. Further, charge or sense amplifiers cannot be fabricated in many low-cost and large-area electronic technologies, such as with printed circuits including organic thin-film transistors. For example, it is impractical to include a charge or sense amplifier in an RFID tag using a printed organic semiconductor process. It is also impractical to include a charge or sense amplifier in a circuit that is disposed on a flexible substrate. Finally, it is not conventionally possible for a charge or sense amplifier to read a ferroelectric memory cell remotely. On this last point, and simply put, there is no conventional manner by which to remotely, or wirelessly, read a ferroelectric memory.

Generally, when reading ferroelectric memories using silicon electronics, a very small charge from the memory can be read without significant difficulty. This is facilitated through the use of the very sensitive (low noise) amplifier, which is easy to produce using silicon electronics, to read the relatively small charge. By contrast, when organic electronics (semiconductors) are used, it is substantially impossible to produce such a sensitive low noise amplifier. This disadvantage in the use of organic electronics and a desire to employ organic semiconductors to read ferroelectric memories combine to require a novel approach in the way that ferroelectric memories are read.

Second, in applying the bias to force the transition necessary to read the change in charge, the conventional reading process, as noted above, writes a fixed value onto the ferroelectric memory cell, causing a "destructive readout." If the state of the memory is to be retained, it must be subsequently rewritten, requiring additional circuitry.

In view of the broad array of applications in which ferroelectric memories are finding common use, it would be advantageous to develop systems and methods that may expand the use of organic electronics in reading ferroelectric memories. As a first step in this process, and in order to achieve other benefits, it would be advantageous to develop systems and methods for reading ferroelectric memories that do away with a requirement for a charge or sense amplifier as an element of the individual memory cells.

It would also be advantageous to develop systems and methods by which ferroelectric memory cells may be read without disturbing the data stored in the ferroelectric memory cells, i.e., not changing a polarization state of the ferroelectric memory cells, thereby providing a "non-destructive" reading process.

Exemplary embodiments of the systems and methods according to this disclosure may provide a capability to read a ferroelectric memory without requiring that a charge or sense amplifier be a part of the ferroelectric memory cell.

Exemplary embodiments may employ various simple circuits to uniquely measure a state of ferroelectric materials that comprise individual electronic components in the various circuits thereby conducting reading of individual ferroelectric memory cells as part of a ferroelectric memory in a non-destructive manner with regard to the polarization state of the ferroelectric memory cells.

Exemplary embodiments may be particularly adapted for use in printed electronic circuits and organic electronic (semiconductor) in these circuits.

Exemplary embodiments may be particularly adapted for circuits disposed on flexible substrates.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for reading and writing ferroelectric memories, particularly for such processes using organic or other thin-film transistors, where the reading is conducted in a non-destructive manner to the stored data and/or the writing function is separated from the reading function, will be described, in detail, with reference to the following drawings, in which.

DETAILED DESCRIPTION OF THE DISCLOSED EMBODIMENTS

The systems and methods for reading and writing ferroelectric memory, particularly for such processes using organic or other thin-film transistors, where the reading is conducted in a non-destructive manner to the stored data, and/or the writing function is separated from the reading function, according to this disclosure will generally refer to these specific utilities for those systems and methods. Exemplary embodiments described and depicted in this disclosure should not be interpreted as being specifically limited to any particular configuration of, for example, a writing/reading circuit, or a control system for controlling such circuits. In fact, any advantageous use of the depicted circuits, and reasonable variations, to support unique reading of ferroelectric memory cells in a manner that does away with the conventional charge or sense amplifier associated with each ferroelectric memory cell in the manner presented in this disclosure is contemplated. The disclosed circuits and schemes are particularly adaptable as unique non-destructive reading processes.

Specific reference to, for example, any particular memory cell configuration should be understood as being exemplary only, and not limited, in any manner, to any particular class of memory cells other than that the disclosed systems and methods are particularly adaptable to memory cells comprising ferroelectric elements, including ferroelectric capacitors, and myriad configurations of ferroelectric transistors.

A particular type of ferroelectric memory cell may include the ferroelectric material as the gate dielectric of a field-effect transistor (FET). This type of ferroelectric memory cell memory is written by applying a bias between the gate of the transistor and the transistor channel. The polarization state of the dielectric influences the threshold voltage of the transistor which can be determined by a number of well-known methods, including sweeping the gate voltage and measuring when, for example, a drain current exceeds a threshold. These ferroelectric memory cells are conventionally considered to suffer from the disadvantages of requiring a custom process for fabrication and of tending to be chemically unstable. Attempts to resolve the latter issue have included using a second gate with the ferroelectric material as the dielectric material on top of a conventional transistor gate. The conventional transistor gate floats and is capacitively coupled to the second gate with the ferroelectric material. In this way, the transistor becomes polarized in response to polarization of the overlying second gate with the ferroelectric material.

Figure 1:
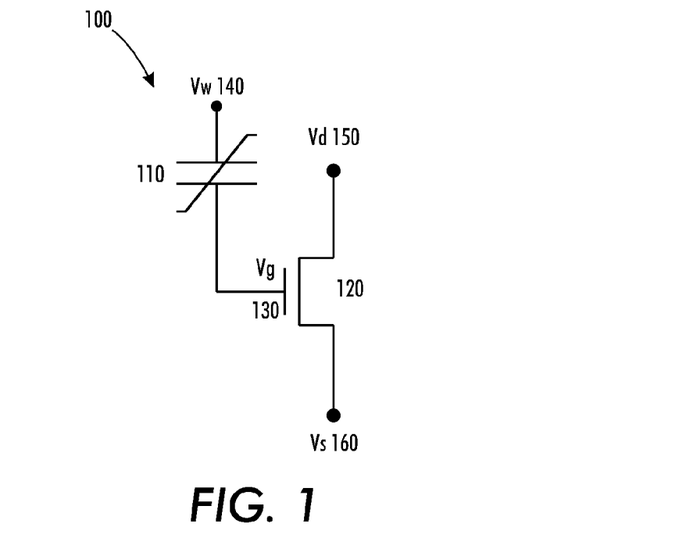
FIG. 1 illustrates a first exemplary embodiment of a ferroelectric memory cell configuration for writing information to, and reading information from, a ferroelectric memory.

FIG. 1 illustrates a first exemplary embodiment of a ferroelectric memory cell configuration 100 for writing information to, and reading information from, a ferroelectric memory. As variations in the first exemplary embodiment of a ferroelectric memory cell configuration 100 shown in FIG. 1 are described below, a common numbering scheme will be employed in this disclosure using individual series numbering keyed to the individual figures in which, to a maximum extent possible common numbering will be used within these series for common components between the embodiments shown in the figures.

As shown in FIG. 1, a separate ferroelectric memory cell capacitor 110 may be connected to the gate of a field effect transistor (FET) 120. In preferred embodiments, the field effect transistor may be a thin-film transistor (TFT). The FET gate voltage Vg 130 may be floating. The ferroelectric memory cell 110 can be written by applying a voltage between a wordline voltage source Vw 140 and the FET 120 channel. Ideally, drain and source voltages, Vd 150 and Vs 160 for the FET 120 may be set to the same voltage during writing.

In embodiments, use of negative voltages, when such voltages are unavailable, is avoided by switching among Vw 140, as well as Vd 150 and Vs 160, to generate both positive and negative polarizations across the ferroelectric memory capacitor 110. During writing, the voltage generated on Vg 130 may be determined by a capacitive voltage divider consisting of the ferroelectric memory cell capacitor 110 capacitance and the FET 120 gate capacitance. As polarization requires a comparatively large voltage across the ferroelectric memory cell capacitor 110, generally the ferroelectric memory cell capacitor 110 capacitance may be small relative to the FET 120 gate capacitance. A relatively large FET 120 gate capacitance, however, tends to reduce the sensitivity of the FET 120 gate-source voltage to the polarization state of the memory cell. This configuration addresses shortfalls in ferroelectric memory cell configuration by providing a ferroelectric capacitor and an FET as separate components.

Figure 2:
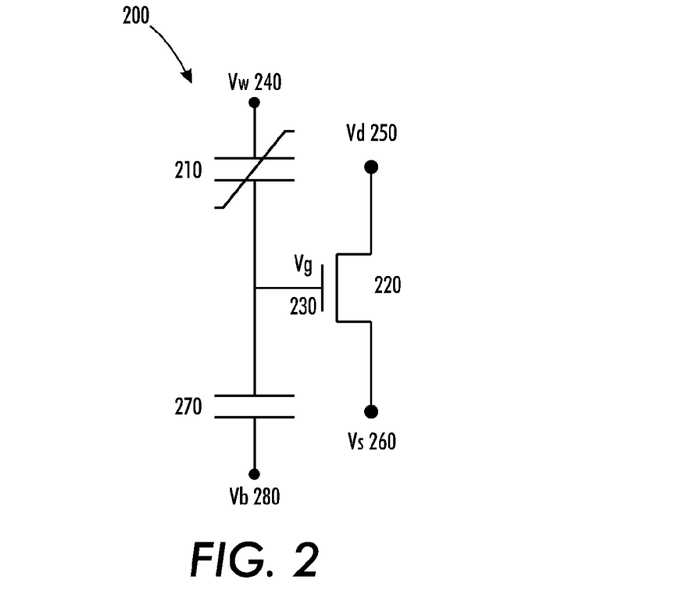
FIG. 2 illustrates a second exemplary embodiment of a ferroelectric memory cell configuration for writing information to, and reading information from, a ferroelectric memory according to this disclosure.

FIG. 2 illustrates a second exemplary embodiment of a ferroelectric memory cell configuration 200 for writing information to, and reading information from, a ferroelectric memory according to this disclosure. The ferroelectric memory cell configuration 200 shown in FIG. 2 may address the shortfalls associated with the basic memory cell configuration 100, as described above.

As shown in FIG. 2, an additional capacitor 270 may be connected to the floating node between the ferroelectric memory cell capacitor 210 and the gate of the FET 220. In this exemplary embodiment, the ferroelectric memory cell capacitor 210 may be written by applying a voltage between a wordline voltage source Vw 240 and a bitline voltage source Vb 280. While the FET 220 gate capacitance, and Vd 250 and Vs 260, still have an influence on Vg 230, by designing the relative capacitances of the ferroelectric memory cell capacitor 210, the additional capacitor 270, and the gate of the FET 220 carefully, and applying a high enough potential between Vw 240 and Vb 280, the ferroelectric memory cell capacitor 210 may be written virtually regardless of the voltages Vd 250 and Vs 260. In particular, if Vd 250 and Vs 260 are allowed to float, i.e., are connected to high impedances, during writing, Vd 250 and Vs 260 may be effectively removed from the writing process.

In the first exemplary embodiment of the ferroelectric memory cell configuration 200 shown in FIG. 2, reading the data stored in the ferroelectric memory cell, as represented by the polarization state of the ferroelectric memory cell, may be carried out by setting both Vb 280 and Vw 240 to a similar potential or to the same potential, e.g., ground, and applying a bias between Vd 250 and Vs 260, and measuring a current through the channel of FET 220. In embodiments, an additional alternating current signal may be applied to at least one of Vd or Vs and an alternating current is measured.

One approach to determining the relative sizes of the devices is to size the additional capacitor 270 to be much larger than the gate capacitance of the FET 220 and to be of a similar magnitude to the ferroelectric memory cell capacitor 210, in the sense that when a potential is applied between Vw 240 and Vb 280 (for example, during writing), the voltage drop across the ferroelectric memory cell capacitor 210 is comparable to or much greater than the voltage drop across the additional capacitor 270, depending on the polarization state of the ferroelectric memory cell 210. During reading, the relative potential between bias between Vw 240 or Vb 280 and Vd 250 or Vs 260 can be set to be much greater than the bias between Vd 250 and Vs 260; a large part of the voltage drop between Vw 240 or Vb 280 and Vd 250 or Vs 260 will be across the gate of the FET 220.

An advantage of the first exemplary embodiment of the ferroelectric memory cell configuration 200 is that this configuration separates the reading and writing functions. By including the additional capacitor 270, a high voltage can be applied across the ferroelectric memory during writing, while large gate-source voltage can be induced on the transistor during reading. Furthermore, a high contrast between bit values can be achieved by biasing the FET 220 in saturation.

Depending on the voltages and the ferroelectric memory cell capacitor 210 that is used, depolarization can be an issue. Generally, ferroelectric memories are very stable when no bias is applied. However, in some cases, over time, the ferroelectric memory cell can become depolarized under even a small bias if it is applied for a long enough period of time. Periodic refreshing of the memory cell, as is well known to those of skill in the art, can ameliorate this problem.

Figure 3:
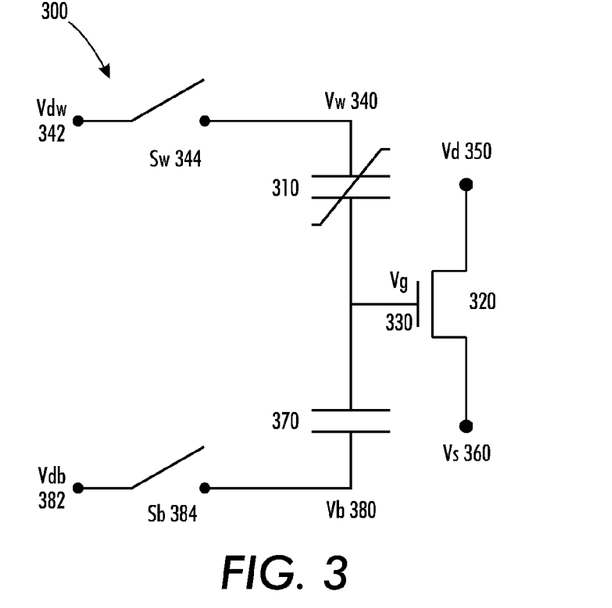
FIG. 3 illustrates a third exemplary embodiment of a ferroelectric memory cell configuration for writing information to, and reading information from, a ferroelectric memory according to this disclosure.

FIG. 3 illustrates a third exemplary embodiment of a ferroelectric memory cell configuration 300 for writing information to, and reading information from, a ferroelectric memory according to this disclosure. As shown in FIG. 3, elements 310, 320, 330, 340, 350. 360, 370 and 380, remain unchanged over the corresponding 200 series elements shown in FIG. 2. FIG. 3 adds to the FIG. 2 configuration a design in which voltage sources, Vdb 382 and Vdw 342, are connected to the ferroelectric memory cell circuit with switches Sb 384 and Sw 344, respectively. In a preferred embodiment the switches 384,344 may be configured of one or more of single transistors, transmission gates, or other types of electronic switches. In the embodiment shown in FIG. 3, the switches Sb 384 and Sw 344 will preferably have comparatively high OFF resistances. By opening these switches, except during read and write operations, the ferroelectric memory cell is decoupled from voltage sources Vdb 382 and Vdw 342. By decoupling the voltage sources employing switches in the manner shown, a likelihood and extent of depolarization may be reduced.

Figure 4:
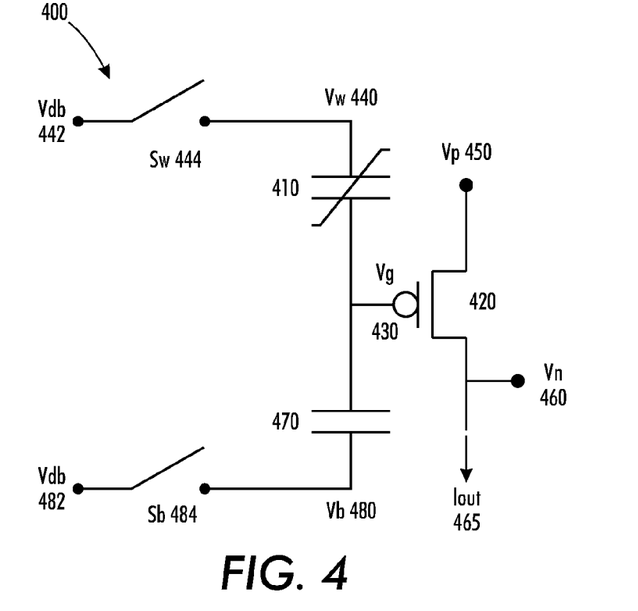
FIG. 4 illustrates a fourth exemplary embodiment of a ferroelectric memory cell configuration for writing information to, and reading information from, a ferroelectric memory according to this disclosure.

In the various embodiments according to this disclosure, the transistor, such as FET 220,320 shown respectively in FIGS. 2 and 3, may be a metal-oxide-semiconductor field-effect transistor or MOSFET, thin-film transistor or TFT, including a-Si, poly-Si, metal-oxide, organic and other composition materials, and may be of either polarity. FIG. 4 illustrates a fourth exemplary embodiment of a ferroelectric memory cell configuration 400 for writing information to, and reading information from, a ferroelectric memory according to this disclosure. As shown in FIG. 4, all of the elements 410-484 of this exemplary embodiment of the ferroelectric memory cell configuration 400 are similar in form and function to all of the corresponding 300 series elements 310-384 in the embodiment shown in FIG. 3. The only deviation in the configuration 400 shown in FIG. 4 over that shown in FIG. 3 is that the transistor 420 is a p-type transistor. It should be noted that no particular configuration to the transistor is necessarily implied by and of the depictions in the various figures or by the accompanying descriptions, which are not to be considered as limiting the disclosed subject matter in any way. In a configuration such as that shown in FIG. 4, data may be read by measuring a current Iout 465 from the transistor 420.

Figure 5:
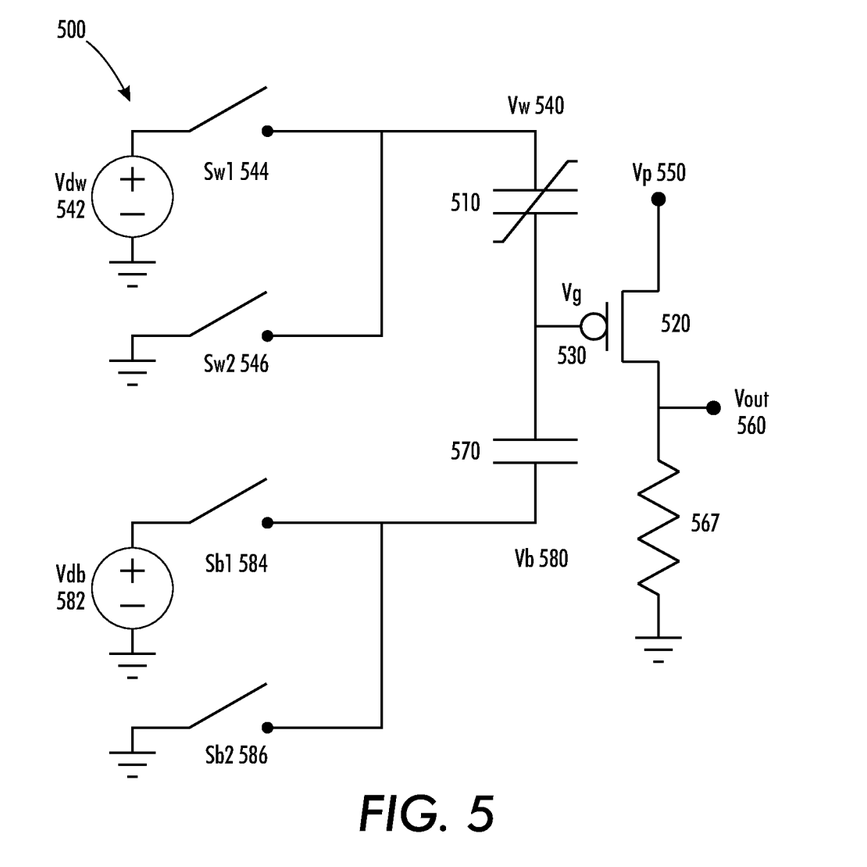
FIG. 5 illustrates a fifth exemplary embodiment of a ferroelectric memory cell configuration for writing information to, and reading information from, a ferroelectric memory according to this disclosure.

FIG. 5 illustrates a fifth exemplary embodiment of a ferroelectric memory cell configuration 500 for writing information to, and reading information from, a ferroelectric memory according to this disclosure. As shown in FIG. 5, all of the elements 510-584 of this exemplary embodiment of the ferroelectric memory cell configuration 500 are substantially similar in form and function to all of the corresponding 400 series elements 410-484 in the embodiment shown in FIG. 4. FIG. 5, however, illustrates what could be considered to be a full read/write circuit. In the exemplary embodiment shown in FIG. 5, voltage sources Vdb 582 and Vdw 542 may be static voltage sources that may be used for writing data to the ferromagnetic memory cell, as described above, based on varying positions of the various switches Sw1 544, Sw2 546, Sb1 584 and Sb2 548, as shown. A resistor 567 is added that may be used to convert the channel current to a voltage Vout 560.

Figure 6:
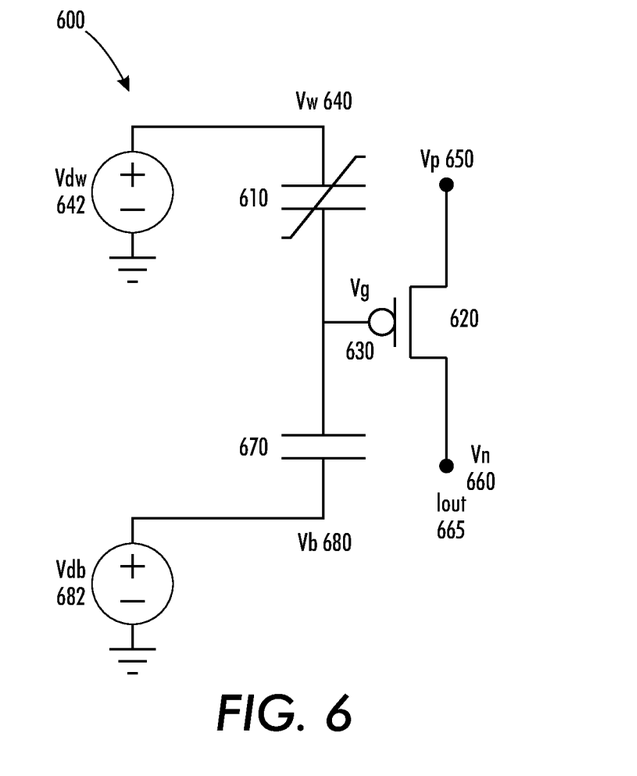
FIG. 6 illustrates a sixth exemplary embodiment of a ferroelectric memory cell configuration for writing information to, and reading information from, a ferroelectric memory according to this disclosure.

FIG. 6 illustrates a sixth exemplary embodiment of a ferroelectric memory cell configuration 600 for writing information to, and reading information from, a ferroelectric memory according to this disclosure. As shown in FIG. 6, all of the elements 610-684 of this exemplary embodiment of the ferroelectric memory cell configuration 600 are substantially similar in form and function to all of the corresponding 400 series elements 410-484 in the embodiment shown in FIG. 4. FIG. 6, however, illustrates that instead of direct current voltage sources, with switches, variable voltage sources Vdw 642 and Vdb 682 may be used.

Principal functions of the various circuits are to provide voltages across the ferroelectric capacitor and additional capacitor stack for writing data to, and reading data from the ferroelectric memory cell and creating high impedance conditions at Vw and Vb otherwise. Many variations of the circuit that provide this functionality are possible.

The advantages in employing the above-discussed exemplary embodiments of the ferroelectric memory cell configurations may include the following. A non-destructive readout of a ferroelectric memory may be provided that generally simplifies a circuit design in doing away with a need for a charge or sense amplifier. At least in this manner, the proposed configurations may be made compatible with less precise technologies, including printed organic TFTs. Also, the disclosed circuit structured may be disposed on flexible substrates. Furthermore, with non-destructive readout, the state of the ferroelectric memory may be read multiple times, at intervals or continuously, without a necessity to rewrite the ferroelectric memory. Separating the reading and writing operations or functions in the exemplary embodiments of the ferroelectric memory cell configurations may allow for large output signals without requiring extraordinarily high voltages for writing. A broad spectrum of available technologies that may have previously been precluded from use may now be exploited in varying reading and writing applications associated with ferroelectric memories. Differing transistors and TFTs can be employed. Individual system components can be separately and optimally formed and then advantageously combined enhancing flexibility in system design and construction. Novel inclusion of the additional (bitline) capacitor provides enhanced flexibility as well in allowing the decoupling of the writing and reading operations. These designs are able to take advantage of a broad spectrum of transistors, including TFTs (with, for example, certain advantages over MOSFETs), as well as a broad spectrum of ferroelectric polymer materials. The disclosed embodiments, as indicated above, are based on an optimization scheme that does not anticipate the ferroelectric memory cell capacitor and memory cell transistor to be formed and/or integrated in a single process that is not optimum for the formation or integration of one or both of the components. This capability is particularly critical for thin-film fabricating processes because fabricating reliable devices is challenging and an ability to separate the fabrication of the ferroelectric capacitor element and from the fabrication of the transistor may lead to improved yields for each component as well as for the combined circuit.

The disclosed schemes overcome disadvantages of conventional configurations in which transistor drain currents are generally too small and relatively noisy to measure in most TFT processes. According to the disclosed schemes, the TFT may be biased in saturation, with a much higher Vds, allowing sufficient current for measurement in virtually any process. In this regard, the disclosed scheme for reading and writing the ferroelectric memory cells memory is unique. Also, according to the disclosed embodiments, the ferroelectric memory cells are read by directly reading the transistor drain current. In this manner, the polarization state of the ferroelectric memory is left undisturbed. This produces a non-destructive reading process. Switching the drain and source voltages so that a negative potential can be applied to the ferroelectric cell, without requiring negative voltages relative to ground, which are not always available or desirable, provides another feature that may aid in expanding the applicability of the disclosed schemes.

Figure 7:
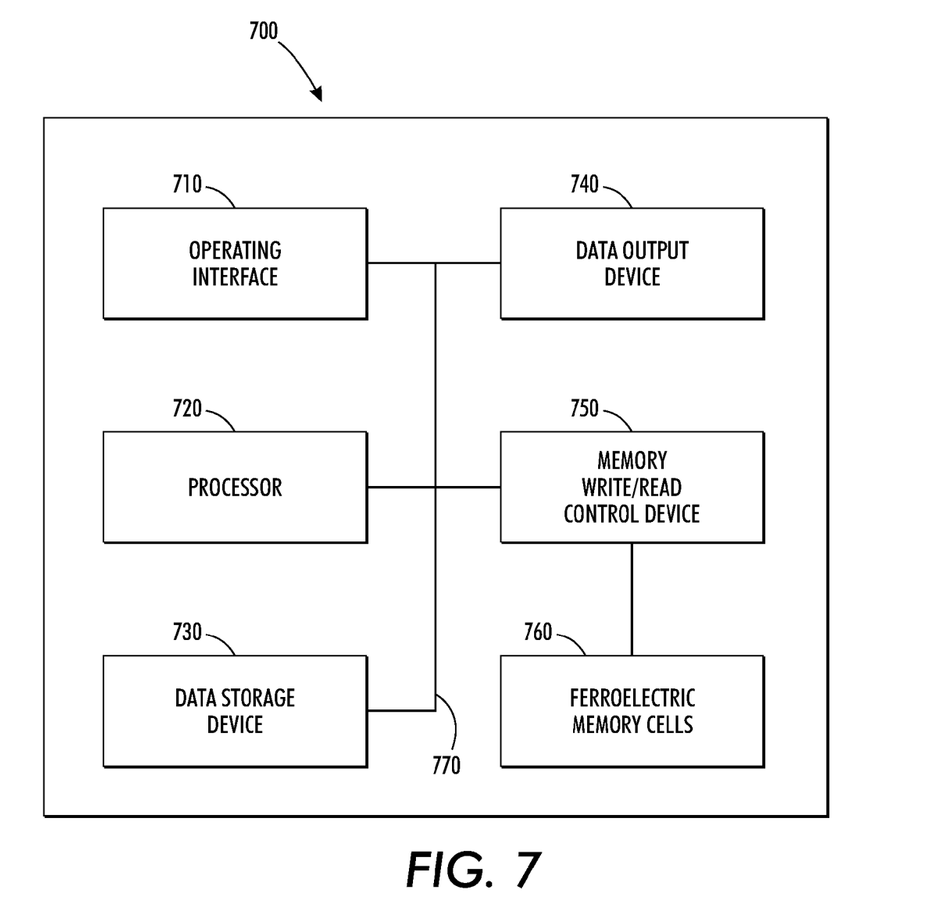
FIG. 7 illustrates a block diagram of an exemplary control system for controlling circuits including ferroelectric memory cells configured for writing information to, and reading information from, a ferroelectric memory according to this disclosure.

FIG. 7 illustrates a block diagram of an exemplary control system 700 for controlling circuits including ferroelectric memory cells configured for writing information to, and reading information from, a ferroelectric memory according to this disclosure.

The exemplary control system 700 may include an operating interface 710 by which a user may communicate with the exemplary control system 700. The operating interface 710 may be configured as one or more conventional mechanisms common to computing devices that permit a user to input information to the exemplary control system 700. The operating interface 710 may include, for example, a conventional keyboard and/or mouse/touchpad pointing system, a touchscreen with "soft" buttons or with various components for use with a compatible stylus, a microphone by which a user may provide oral commands to the exemplary control system 700 to be "translated" by a voice recognition program, or other like device by which a user may communicate specific operating instructions to the exemplary control system 700.

The exemplary control system 700 may include one or more local processors 720 for individually operating the exemplary control system 700 and for carrying out operating functions for writing to and reading from ferroelectric memory cells using variations of the exemplary embodiments of the ferroelectric memory cell configurations (ferroelectric memory cells) 760, such as those depicted in FIGS. 2-6 and as described above, and variations thereof. Processor(s) 720 may include at least one conventional processor or microprocessor that interprets and executes instructions to direct specific functioning of the exemplary control system 700. Processor(s) 720 may initiate and control the communications with, and interpretation of the data and/or signals recovered from the ferroelectric memory cells 760.

The exemplary control system 700 may include one or more data storage devices 730. Such data storage device(s) 730 may be used to store data or operating programs to be used by the exemplary control system 700, and specifically the processor(s) 720 in carrying out their control of reading and writing processes including the ferroelectric memory cells 760 according to the disclosed schemes. Data storage device(s) 730 may be used to temporarily store data recovered from the ferroelectric memory cells for compilation and display in a form usable by a user when the ferroelectric memory cells are read. The data storage device(s) 730 may include a random access memory (RAM) or another type of dynamic storage device that is capable of storing updatable information, and for separately storing instructions for execution of system operations by, for example, processor(s) 720. Data storage device(s) 730 may also include a read-only memory (ROM), which may include a conventional ROM device or another type of static storage device that stores static information and instructions for processor(s) 720. Further, the data storage device(s) 730 may be integral to the exemplary control system 700, or may be provided external to, and in wired or wireless communication with, the exemplary control system 700.

The exemplary control system 700 may include at least one data output device 740 which may be configured as one or more conventional mechanisms that output information to a user, including a digital display screen, or in combination with the operating interface 710 may represent some manner of graphical user interface or GUI. The data output device 740 may be employed, for example, to output data recovered from a ferroelectric memory in a form that is usable by a user of the exemplary control system 700.

The exemplary control system 700 may include a memory write/read control device 750 by for directing the generating of voltage signals and for interpreting current measurements across transistor channels in the ferroelectric memory cells 760. The memory write/read control device 750 may operate in conjunction with the processor(s) 720 and/or the data storage device(s) 730, or as a stand-alone device, that is configured to control voltage sources and/or switching from voltage sources to the ferroelectric memory cells and to interpret measurements of current across the transistor channels in the ferroelectric memory cells 760 as indications of a polarization state of the ferroelectric memory cells 760, and to convert that data into a form that is effectively processed by the exemplary control system 700, for example, for display on a display screen of the data output device 740.

All of the various components of the exemplary control system 700, as depicted in FIG. 7, may be connected by one or more data/control busses 770. These data/control busses 770 may provide wired or wireless communication between the various components of the exemplary control system 700, whether all of those components are housed integrally in, or are otherwise external to and in communication with the exemplary control system 700.

It should be appreciated that, although depicted in FIG. 7 as an integral unit, the various disclosed elements of the exemplary control system 700 may be arranged in any combination of sub-systems as individual components or combinations of components, integral to a single unit, or external to, and in wired or wireless communication with other components or subsystems of the exemplary control system 700. In other words, no specific configuration as an integral unit or as a support unit is to be implied by the depiction in FIG. 7. Further, although depicted as individual units for ease of understanding of the details provided in this disclosure regarding the exemplary control system 700, it should be understood that the described functions of any of the individually-depicted components may be undertaken, for example, by one or more processors 720 connected to, and in communication with, one or more data storage devices 730.

Figure 8:
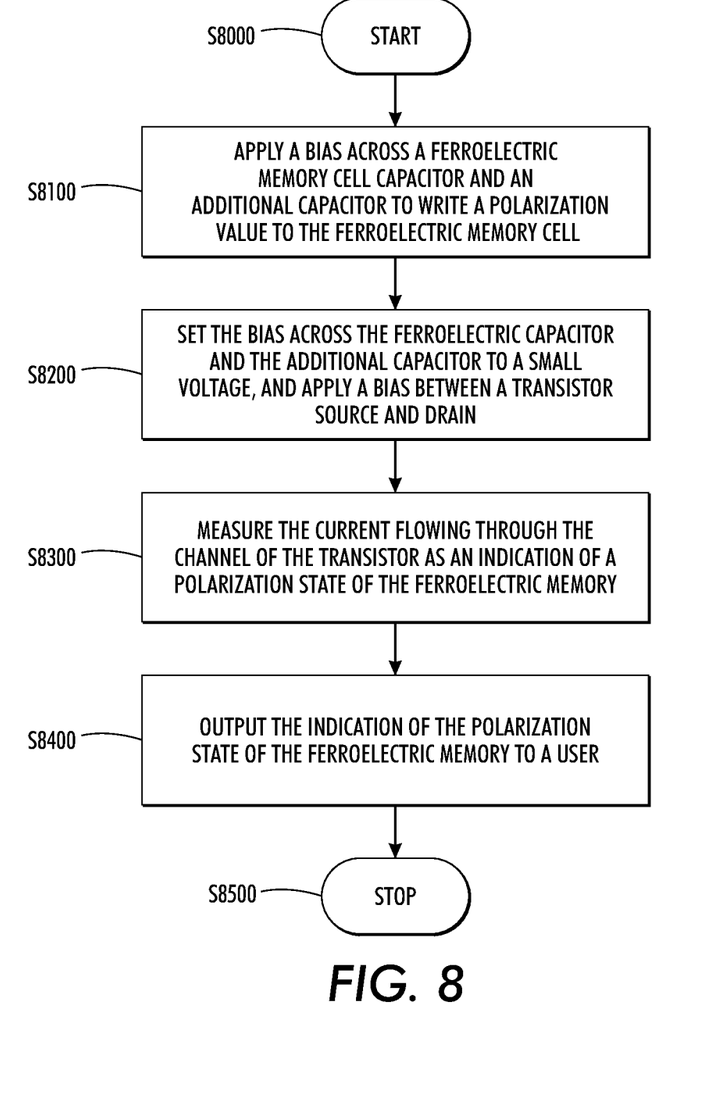
FIG. 8 illustrates a flowchart of an exemplary method for writing information to, and reading information from a ferroelectric memory according to this disclosure.

The disclosed embodiments may include a method for writing information to, and reading information from a ferroelectric memory according to this disclosure. FIG. 8 illustrates a flowchart of an exemplary method for writing information to, and reading information from a ferroelectric memory according to this disclosure. The exemplary method may be used to write information to a ferroelectric memory cell including a ferroelectric capacitor, a transistor and, optionally, at least one additional capacitor connected to a floating node between the ferroelectric capacitor and the transistor. Specific switching, and/or control, of various voltages in the ferroelectric memory cell will cause information to be written to the ferroelectric memory cell separately from any reading operation of the ferroelectric memory cell. Reading of the ferroelectric memory cell may be accomplished by isolating the writing voltages via switching, or other means, and by controlling voltages across a transistor channel to apply a bias to the transistor channel, and by measuring a current across the transistor channel as an indication of a polarization state of the ferroelectric memory cell. As shown in FIG. 8, operation of the method commences at Step S8000 and proceeds to Step S8100.

In Step S8100, a bias may be applied across a ferroelectric memory cell capacitor and an additional capacitor to write a polarization value to the ferroelectric memory cell. The individual capacitances of the ferroelectric memory cell capacitor and the additional capacitor may be selected to avoid overloading a gate of a transistor to which the ferroelectric memory cell capacitor and the additional capacitor are connected. Operation of the method proceeds to Step S8200.

In Step S8200, separate from the writing process, the voltages for applying the bias across the ferroelectric memory cell capacitor and the additional capacitor should be set to a substantially same potential, e.g., ground. In a reading process, a bias may be applied between a transistor source and drain. Operation of the method proceeds to Step S8300.

In Step S8300, a current flowing through the transistor channel may be measured. The magnitude of the current flowing through the transistor channel will provide an indication of the polarization state of the ferroelectric memory. Operation of the method proceeds to Step S8400.

In Step S8400, indications of polarization states of a plurality of ferroelectric memory cells may be output, for example, to a display device, in a form that is interpreted for and usable by a user. Operation of the method proceeds to Step S8500, where operation of the method ceases.

The disclosed embodiments may include a non-transitory computer-readable medium storing instructions which, when executed by a processor, may cause the processor to execute all, or at least some, of the steps of the method outlined above.

The above-described exemplary systems and methods reference certain conventional components to provide a brief, general description of suitable operating, computing and communicating environments in which the subject matter of this disclosure may be implemented for familiarity and ease of understanding. Although not required, embodiments of the disclosure may be provided, at least in part, in a form of hardware circuits, firmware, or software computer-executable instructions to carry out the specific control, writing and reading functions described. These may include individual program modules executed by a processor. Generally, program modules include routine programs, objects, components, data structures, and the like that perform particular tasks or implement particular data types in support of the overall objective of the systems and methods according to this disclosure.

Those skilled in the art will appreciate that other embodiments of the disclosed subject matter may be practiced using various configurations of ferroelectric memory cells. Embodiments according to this disclosure may be practiced in differing computing environments where tasks are performed by local and remote devices that may, for example, remotely read information stored in ferroelectric memories. Remotely-located devices and components may be linked to each other by hardwired links, wireless links, or a combination of both through a communication network. In a distributed computing environment, program modules may be located in both local and remote memory storage devices.

As indicated above, embodiments within the scope of this disclosure may also include computer-readable media having stored computer-executable instructions or data structures that can be accessed, read and executed by one or more processors. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures. When information is transferred or provided over a network or another communications connection, whether wired, wireless, or in some combination of the two, the receiving processor properly views the connection as a computer-readable medium. Thus, any such connection is properly termed a computer-readable medium. Combinations of the above should also be included within the scope of the computer-readable media for the purposes of this disclosure.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of executable instructions or associated data structures represents one example of a corresponding sequence of acts for implementing the functions described in the steps. The exemplary depicted steps may be executed in any reasonable order to effect the objectives of the disclosed embodiments. No particular order to the disclosed steps of the method is necessarily implied by the depiction in FIG. 8, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure. For example, the principles of the disclosure may be applied to each individual memory unit of a plurality of memory units. A particular user need not be operating a system, for example, that is in communication contact with all available memory units at any particular time. It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

I claim:

1. A ferroelectric memory cell, comprising:
   a ferroelectric memory capacitor that stores a polarization state of the ferroelectric memory cell;
   a transistor, a gate of the transistor being connected to a first electrode of the ferroelectric memory capacitor, the ferroelectric memory capacitor being a separate electronic component from the transistor; and
   an alternating current signal source that applies an alternating current signal to a channel of the transistor and that measures a magnitude of an alternating current through the channel of the transistor as an indication of a polarization state of the ferroelectric memory cell.

2. The ferroelectric memory cell of claim 1, further comprising an additional capacitor, a first electrode of the additional capacitor being connected to the gate of the transistor.

3. The ferroelectric memory cell of claim 2, further comprising:
   a first voltage source connected to a second electrode of the ferroelectric capacitor on an opposite side of the ferroelectric memory capacitor from the gate of the transistor;
   at least one second voltage source that applies a bias across a channel of the transistor; and
   a third voltage source connected to a second electrode of the additional capacitor on an opposite side of the additional capacitor from the gate of the transistor.

4. The ferroelectric memory cell of claim 3,
   the ferroelectric memory cell being written by applying a voltage between the first voltage source and the third voltage source,
   the writing being irrespective of a voltage of the at least one second voltage source, and
   the ferroelectric memory cell being read by setting both the first voltage source and the third voltage source to a substantially same potential, applying a bias from the at least one second voltage source across a channel of the transistor, and measuring the current through the channel of the transistor as an indication of a polarization state of the ferroelectric memory cell.

5. The ferroelectric memory cell of claim 3, the first voltage source and the third voltage source being switchable to generate positive and negative polarization across the ferroelectric memory capacitor.

6. The ferroelectric memory cell of claim 5, the first voltage source and the third voltage source being switchable by at least one of a first switch being interposed between the first voltage source and the second electrode of the ferroelectric memory capacitor and a second switch being interposed between the third voltage source and the second electrode of the additional capacitor.

7. The ferroelectric memory cell of claim 6, the first switch and the second switch being open except during writing and reading operations for the ferroelectric memory cell.

8. The ferroelectric memory cell of claim 6, at least one of the first switch and the second switch being one of a single transistor and a transmission gate.

9. The ferroelectric memory cell of claim 6, at least one of the first switch and the second switch being multiple switches for applying differing potentials respectively to at least one of the second electrode of the ferroelectric memory cell capacitor and the second electrode of the additional capacitor from separate voltage sources of different potentials.

10. The ferroelectric memory cell of claim 3, at least one of the first and third voltage sources being a variable voltage source.

11. The ferroelectric memory cell of claim 1, the transistor being one of a metal-oxide-semiconductor field-effect transistor (MOSFET) and a thin-film transistor (TFT).

12. The ferroelectric memory cell of claim 1, the transistor being one of an n-type transistor or a p-type transistor.

13. The ferroelectric memory cell of claim 1, at least the ferroelectric memory cell capacitor and the transistor being disposed on one or more flexible substrates.

14. The ferroelectric memory cell of claim 1, further comprising a resistor connected to the channel of the transistor for converting a current through the channel of the transistor to a voltage.

15. A write/read system for writing and reading a ferroelectric memory cell, the ferroelectric memory cell including a ferroelectric memory capacitor that stores a polarization state of the ferroelectric memory cell; and a transistor, a gate of the transistor being connected to a first electrode of the ferroelectric memory capacitor, the ferroelectric memory capacitor being a separate electronic component from the transistor, the write/read system comprising:
- a first voltage source connected to a second electrode of the ferroelectric memory capacitor on an opposite side of the ferroelectric memory capacitor from the gate of the transistor;
- at least one second voltage source that applies a bias across a channel of the transistor;
- a measuring device for measuring a current through the channel of the transistor as an indication of a polarization state of the ferroelectric memory cell;
- an additional capacitor with a first electrode connected to the gate of the transistor; and a third voltage source connected to a second electrode of the additional capacitor on an opposite side of the additional capacitor from the gate of the transistor;
- a processor that is programmed to cause an alternating current signal source to apply an alternating current signal to the channel of the transistor, the measuring device measuring a magnitude of an alternating current through the channel of the transistor as an indication a polarization state of the ferroelectric memory cell; and
- an output device that displays data based on a result of the measuring by the measuring device to a user as an indication of read data stored in the ferroelectric memory cell.

16. The write/read system of claim 15, further comprising:
- a processor that is programmed to cause a voltage to be applied between the first voltage source and the third voltage source to write the ferroelectric memory cell irrespective of a voltage of the at least one second voltage source, and to (1) set both the first voltage source and the third voltage source to a substantially same potential, and (2) apply a bias from the at least one second voltage source across the channel of the transistor, the measuring device measuring the current through the channel of the transistor while the bias from the at least one second voltage source is applied as an indication of the polarization state of the ferroelectric memory cell; and
- an output device that displays data based on a result of the measuring by the measuring device to a user as an indication of read data stored in the ferroelectric memory cell.

17. The write/read system of claim 15, the first voltage source and the third voltage source being switchable to generate positive and negative polarization across the ferroelectric memory capacitor.

18. The write/read system of claim 17, the first voltage source and the third voltage source being switchable by at least one of a first switch being interposed between the first voltage source and the second electrode of the ferroelectric memory capacitor and a second switch being interposed between the third voltage source and the second electrode of the additional capacitor.

19. The write/read system of claim 18, at least one of the first switch and the second switch being one of a single transistor and a transmission gate.

20. The write/read system of claim 18, at least one of the first switch and the second switch being multiple switches for applying differing potentials respectively to at least one of the second electrode of the ferroelectric memory cell capacitor and the second electrode of the additional capacitor from separate voltage sources of different potentials.

21. The write/read system of claim 15, at least one of the first voltage source and the third voltage source being a variable voltage source.

22. The write/read system of claim 15, a plurality of circuit components of the write/read system being disposed on one or more flexible substrates.

* * * * *